United States Patent
Wood et al.

(10) Patent No.: US 6,407,478 B1
(45) Date of Patent: Jun. 18, 2002

(54) SWITCHES AND SWITCHING ARRAYS THAT USE MICROELECTROMECHANICAL DEVICES HAVING ONE OR MORE BEAM MEMBERS THAT ARE RESPONSIVE TO TEMPERATURE

(75) Inventors: Robert L. Wood, Cary; Vivek Agrawal, Durham, both of NC (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/935,003

(22) Filed: Aug. 21, 2001

Related U.S. Application Data

(60) Provisional application No. 60/226,743, filed on Aug. 21, 2000.

(51) Int. Cl.⁷ .............................................. H01H 37/32

(52) U.S. Cl. ...................................... 310/307; 310/309

(58) Field of Search .................................. 310/307, 309

(56) References Cited

U.S. PATENT DOCUMENTS

| | | | |
|---|---|---|---|
| 5,072,288 A | * 12/1991 | MacDonald et al. | 357/68 |
| 5,629,565 A | * 5/1997 | Schlaak et al. | 257/780 |
| 5,955,817 A | 9/1999 | Dhuler et al. | 310/307 |
| 6,028,689 A | 2/2000 | Michalicek et al. | 359/224 |
| 6,040,935 A | 3/2000 | Michalicek | 359/198 |
| 6,137,206 A | * 10/2000 | Hill | 310/306 |
| 6,175,170 B1 | * 1/2001 | Kota et al. | 310/40 MM |
| 6,238,040 B1 | * 5/2001 | Silverbrook | 347/54 |
| 6,239,685 B1 | * 5/2001 | Albrecht et al. | 333/365 |
| 6,245,246 B1 | * 6/2001 | Silverbrook | 216/27 |
| 6,321,654 B1 | * 11/2001 | Robinson | 102/251 |
| 6,322,374 B1 | 11/2001 | Comtois et al. | 439/75 |

OTHER PUBLICATIONS

Tuantranont et al. "Bulk–etched Surface Micromachined and Flip–Chip Integrated Micromirror Array for Infrared Applications," *2000 IEEE/LEOS International Conference on Optical MEMS*. Aug. 21–24, 2000, pp. 71–72.

Michalicek et al. "Design and Characterization of Next–Generation Micromirrors Fabricated in a Four–Level, Planarized Surface–Micromachined Polychrystalline Silicon Process," *1997 Proceedings Second Annual IEEE International Conference on Innovative Systems in Silicon.* Oct. 8–10, 1997, pp. 144–154.

Sene et al. "Development and Characterization of Micro–Mechanical Gratings for Optical Modulation." *IEEE 1996 Proceedings. An Investigation of Micro Structures, Sensors, Actuators, Machines and Systems. The Ninth Annual International Workshop.* Feb. 11–15, 1996, pp. 222–227.

Harsh et al. "Flip–Chip Assembly for Si–Based RF MEMS," *Twelfth IEEE International Conference on Micro Electro Mechanical Systems, Technical Digest.* Jan.17–21, 1999, pp. 273–278.

(List continued on next page.)

Primary Examiner—Thomas M. Dougherty
(74) *Attorney, Agent, or Firm*—Myers Bigel Sibley & Sajovec

(57) ABSTRACT

A microelectromechanical device comprises first and second beam members that have respective first ends connected to anchors, and that are also connected together. The first and second beam members are connected to a dielectric tether by a first tether anchor. The microelectromechanical device further comprises a third beam member that has a first end that is connected to an anchor and that is connected to the dielectric tether by a second tether anchor. At least one of the first and the second beam members are configured to elongate when the first and/or the second beam member is heated to a temperature that is greater than a temperature of the third beam member.

38 Claims, 13 Drawing Sheets

OTHER PUBLICATIONS

Michalicek et al. "Flip–Chip Fabrication of Advanced Micromirror Arrays," *The 14th IEEE International Conference on Micro Electro Mechanical Systems, Technical Digest*. Jan. 21–25, 2001, pp. 313–316.

Tuantranont et al. "Smart Phase–Only Micromirror Array Fabricated by Standard CMOS Process," *The Thirteenth Annual International Conference on Micro Electro Mechanical Systems, Proceedings*. Jan. 23–27, 2000, pp. 455–460.

Burns et al. "Micro–Electro–Mechanical Focusing Mirrors," *IEEE 1998 Proceedings. An Investigation of Micro Structures, Sensors, Actuators, Machines and Systems. The Eleventh Annual International Workshop*. Jan. 25–29, 1998, pp. 460–465.

Burns et al. "Micro–Electro–Mechanical Variable Blaze Gratings," *IEEE 1997 Proceedings. An Investigation of Micro Structures, Sensors, Actuators, Machines and Robots. The Tenth Annual International Workshop*. Jan. 26–30, 1997, pp. 55–60.

Reid et al. "Automated Assembly of Flip–Up Micrometers," *1997 International Conference on Solid–State Sensors and Actuators*. Digest of Technical Papers, vol. 1. Jun. 16–19, 1997, pp. 347–350.

Comtois et al. "Characterization of Electrothermal Actuators and Arrays Fabricated in a Four–Level, Planarized Surface–Micromachined Polychrystalline Silicon Process," *1997 International Conference on Solid–State Sensors and Actuators*. Digest of Technical Papers, vol. 1. Jun. 16–19, 1997, pp. 769–772.

Reid et al. "A Surface Micromachine Rotating Micro–Mirror Normal to the Substrate," *Digest IEEE/LEOS Summer Topical Meeting, Advanced Applications of Lasers in Materials and Proceeding/Broadband Optical Networks/Smart Pixels/ Optical MEMs and Their Applications*. Aug. 5–9, 1996, pp. 39–40.

Michalicek, Adrian M. Introduction to Microelectromechanical Systems. University of Colorado. http://mems.colorado.edu/c1.res.ppt/cat.g.shtml. May 18, 2000, Slides 1–60.

* cited by examiner

SWITCHES AND SWITCHING ARRAYS THAT USE MICROELECTROMECHANICAL DEVICES HAVING ONE OR MORE BEAM MEMBERS THAT ARE RESPONSIVE TO TEMPERATURE

RELATED APPLICATION

This application claims the benefit of U.S. Provisional Application No. 60/226,743, filed Aug. 21, 2000, the disclosure of which is hereby incorporated herein by reference.

BACKGROUND OF THE INVENTION

The present invention relates generally to the field of microelectromechanical devices, and, more particularly, to microelectromechanical thermal actuator devices.

Microelectromechanical systems (MEMS) may be used as alternatives for conventional electromechanical devices and systems, such as relays, switches, and switching arrays. In general, switches and switching arrays may be implemented using MEMS or non-MEMS devices. For example, a non-MEMS switching array may use an array of conventional latching electromechanical relays that are mounted on a circuit card. Unfortunately, the array dimension of such a switching array may be limited due to the physical size of the relays. Switching arrays may be designed, however, using multiple MEMS switches, which may be arrayed on a single die. This approach may allow for larger array dimensions and may also allow the switching array to be integrated with other on-chip circuit elements. Conventional MEMS based switching arrays, however, may use relatively large actuators to achieve mechanical row-column addressing. Moreover, conventional MEMS based switching arrays may be manufactured using relatively complex fabrication technology. Accordingly, there exists a need for improved MEMS based switching devices and switching arrays.

SUMMARY OF THE INVENTION

Embodiments of the present invention provide switches and switching arrays that use microelectromechanical devices that have one or more beam members that are responsive to temperature. For example, a microelectromechanical device comprises first and second beam members that have respective first ends connected to anchors, and that are also connected together. The first and second beam members are connected to a dielectric tether by a first tether anchor. The microelectromechanical device further comprises a third beam member that has a first end that is connected to an anchor and that is connected to the dielectric tether by a second tether anchor. At least one of the first and the second beam members are configured to elongate when the first and/or the second beam member is heated to a temperature that is greater than a temperature of the third beam member. By using two beam members to carry a control current to heat one or both of the two beam members, microelectromechanical devices, in accordance with embodiments of the present invention, may electrically isolate a control signal path defined by the first and the second beam members from a load signal path defined by a third beam member.

In other embodiments, the microelectromechanical device further comprises a tab attached to the dielectric tether anchor.

In further embodiments, the microelectromechanical device further comprises a substrate, and the anchors are attached to the substrate.

In still further embodiments of the present invention, the substrate has a trench etched therein that extends under at least a portion of the first and the second beam members. The trench may reduce the heat loss from the first and second beam members to thereby improve actuation distance of the first and second beam members for a given control power. The trench may also increase the signal isolation between the first and second beam members and the third beam member.

The present invention may also be embodied as a microelectromechanical switch that comprises a substrate, a pair of switch contacts attached to the substrate, and first and second actuators. The first actuator has a first end that is connected to the substrate, and has a contact connected thereto. The first actuator further comprises a first tab that is attached to the contact. The first actuator is operable to deflect in response to an electrical current. The second actuator has a first end that is connected to the substrate and has a second tab that is connected thereto. The second actuator is operable to deflect in response to an electrical current. The first and the second actuators are positioned such that the contact electrically connects the pair of switch contacts when the first tab engages the second tab between the pair of switch contacts and the second tab. Furthermore, the contact does not electrically connect the pair of switch contacts when the second tab engages the first tab between the pair of switch contacts and the first tab.

In other embodiments of the present invention, the first and the second actuators each comprise a first beam member and a second beam member.

In still other embodiments of the present invention, the contact comprises a first conductive region, which connects first and the second beam members of the first actuator, a second conductive region, and an isolation region that electrically isolates the first conductive region from the second conductive region.

The present invention may also be embodied as a switching array that comprises a substrate, a row signal path on the substrate that comprises a plurality of first switch contacts, and a column signal path on the substrate that comprises a plurality of second switch contacts. The switching array further comprises one or more first actuators that have an end that is connected to the substrate and have a contact, with a first tab attached thereto, connected thereto. At least one of the first actuators is operable to deflect in response to an electrical current. The switching array further comprises one or more second actuators that have an end that is connected to the substrate and have a second tab connected thereto. At least one of the second actuators is operable to deflect in response to an electrical current. The first and the second actuators are positioned such that the contact electrically connects one of the first plurality of switch contacts to one of the second plurality of switch contacts when the first tab engages the second tab between the switch contacts and the second tab. Furthermore, the contact does not electrically connect one of the first plurality of switch contacts to one of the second plurality of switch contacts when the second tab engages the first tab between the switch contacts and the first tab.

Although described above primarily with respect to device or apparatus aspects of the present invention, the present invention may also be embodied as methods of operating microelectromechanical devices, microelectromechanical switches, and switching arrays.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
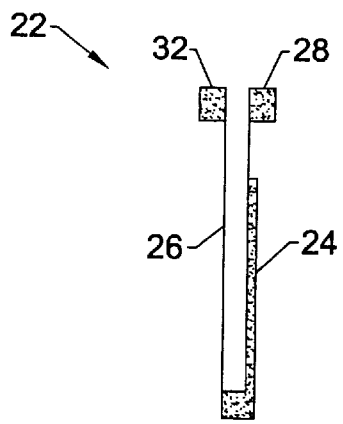
FIGS. 1–5 illustrate a conventional microelectromechanical device that is operable in response to thermal energy.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. It will also be understood that when an element is referred to as being "attached," "connected," and/or "coupled" to another element, it can be directly attached, connected, and/or coupled to the other element or intervening elements may be present. In contrast, when an element is referred to as being "directly attached," "directly connected," and/or "directly coupled" to another element, there are no intervening elements present. Like reference numbers signify like elements throughout the description of the figures.

Referring now to FIGS. 1–5, a conventional microelectromechanical device that is operable in response to thermal energy will be described hereafter. As shown in FIG. 1, a microelectromechanical device 22 comprises a beam member 24 and a beam member 26. The beam member 24 may be called a "cold" beam and the beam member 26 may be called a "hot" beam. The beam member 24 is connected at a first end to an anchor 28 and the beam member 26 is connected at a first end to an anchor 32. The second ends of the beam member 24 and the beam member 26 are connected to each other to complete an electrical circuit between the anchors 28 and 32.

Figure 2:
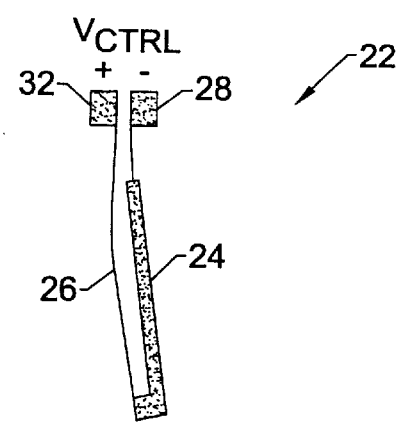

Referring now to FIG. 2, by applying a control voltage $V_{ctrl}$ to generate a current through the microelectromechanical device 22, the second ends of the beam member 24 and the beam member 26 (i.e., the tip of the microelectromechanical device 22) are caused to deflect towards the beam member 24. For example, the beam member 24 may be configured to have an electrical resistance per unit of length that is less than an electrical resistance per unit of length of the beam member 26. By passing current through the beam members 24 and 26, the beam member 26 may heat relative to the beam member 24. The beam member 26 may elongate from an initial configuration, which causes the tip of the microelectromechanical device 22 to deflect towards the beam member 24.

If the current applied to the microelectromechanical device 22 is kept below a limit, which is determined by the physical configuration of the microelectromechanical device 22, then the microelectromechanical device 22 will return to the position shown in FIG. 1 once the current is removed. If, however, the current applied to the microelectromechanical device 22 exceeds the aforementioned limit, then the microelectromechanical device 22 may be biased to rest in a new position once the current is removed.

Figure 3:
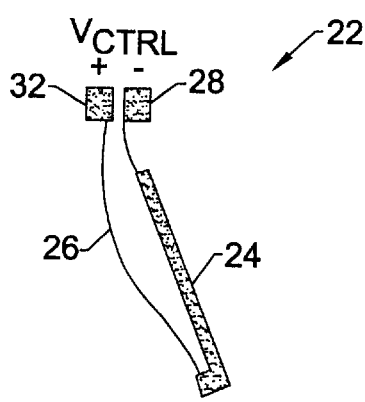
Figure 4:
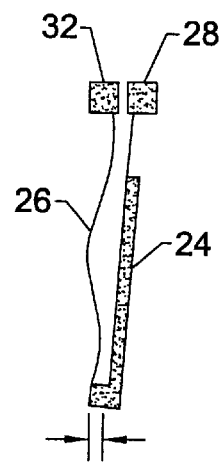
Figure 5:
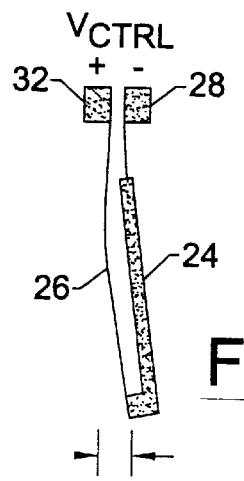

Referring now to FIG. 3, the microelectromechanical device 22 is biased by applying a current that exceeds the limit that allows the microelectromechanical device 22 to return to the position of FIG. 1 once the current is removed. This excessive current causes localized annealing in the beam member 26 as shown in FIG. 3. The localized annealing results in localized shrinkage of the beam member 26. As a result, when the current is terminated as shown in FIG. 4, the microelectromechanical device 22 returns to a position in which the tip is deflected towards the beam member 26. This back-bending effect may be useful to provide mechanical biasing of various structures, such as a latch structure. Referring now to FIG. 5, upon applying the control voltage $V_{ctrl}$ to the biased microelectromechanical device 22 of FIG. 4, the tip of the microelectromechanical device 22 deflects towards the beam member 24 as shown. The microelectromechanical device 22 shown in FIGS. 1–5 may be referred to as an actuator or a "heatuator" because it deflects in response to asymmetric heating of the beam member 24 and the beam member 26.

Figure 6:
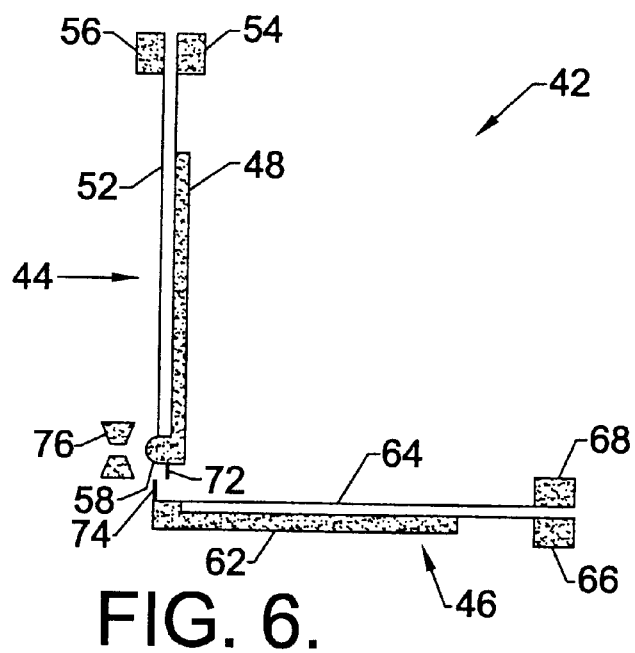
FIGS. 6–9 illustrate microelectromechanical switches in accordance with embodiments of the present invention.

Referring now to FIGS. 6–9, microelectromechanical switches, in accordance with embodiments of the present invention, will be described hereafter. As shown in FIG. 6, a microelectromechanical switch 42, in an "as fabricated" configuration, comprises a first actuator 44 and a second actuator 46. The first actuator 44 comprises a beam member 48 and a beam member 52 that have first ends connected to a first anchor 54 and a second anchor 56, respectively. The first actuator 44 further comprises a contact 58 that connects the second ends of the beam member 48 and the beam member 52, and has a first tab 72 disposed thereon. Similarly, the second actuator 46 comprises a beam member 62 and a beam member 64 that have first ends connected to a third anchor 66 and a fourth anchor 68, respectively. The second ends of the beam member 62 and the beam member 64 are connected together, and have a second tab 74 disposed thereat. A pair of switch contacts 76 is positioned proximal to the contact 58. The first, second, third, and fourth anchors 54, 56, 66, and 68 may be attached to, for example, a substrate. It should be understood that the contact 58 need not connect the beam member 48 and the beam member 52 at the ends thereof in other embodiments of the present invention, but may connect the beam member 48 and the beam member 52 at midpoints thereof. Similarly, the beam member 62 and the beam member need not be connected to each other at ends thereof in other embodiments of the present invention, but may be connected to each other at midpoints thereof.

Figure 7:
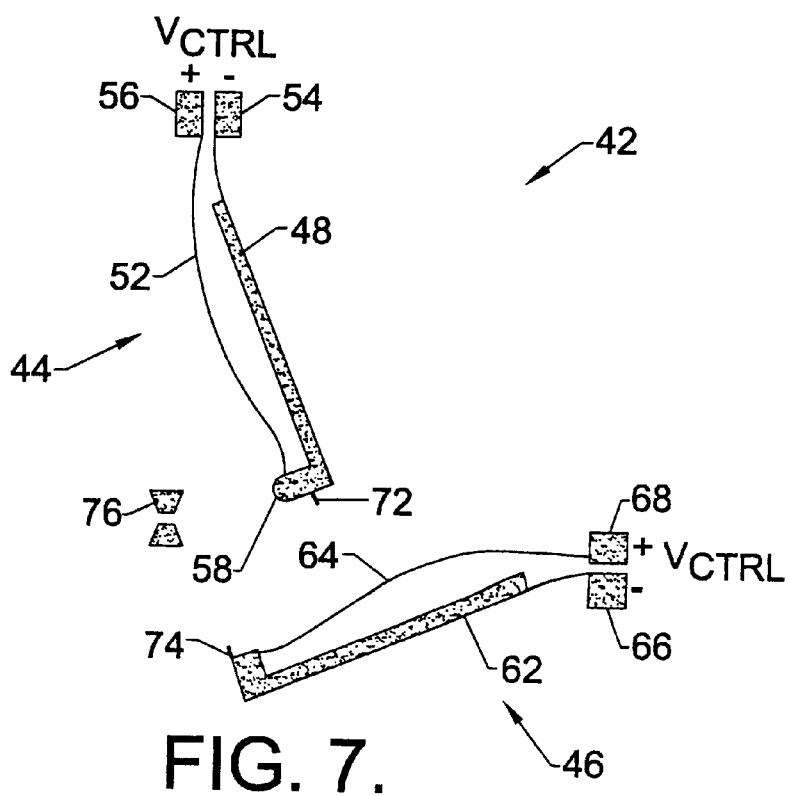

Referring now to FIG. 7, a control voltage $V_{ctrl}$ is applied to the first, second, third, and fourth anchors 54, 56, 66, and 68 to cause a current to flow through the first and the second actuators 44 and 46, which results in deflection of both the first and the second actuators 44 and 46 towards the respective beam members 48 and 62. Moreover, the control voltage $V_{ctrl}$ may be set to a level to cause the currents to rise to a level in the first and the second actuators 44 and 46 that causes localized annealing in the beam members 52 and 64 as shown in FIGS. 7–9.

Depending on the order in which the control voltage $V_{ctrl}$ is removed from the first and the second actuators 44 and 46, the switch contacts may be electrically connected by the contact 58 (e.g., a switch closed state) or may remain electrically isolated (e.g., a switch open state).

Figure 8:
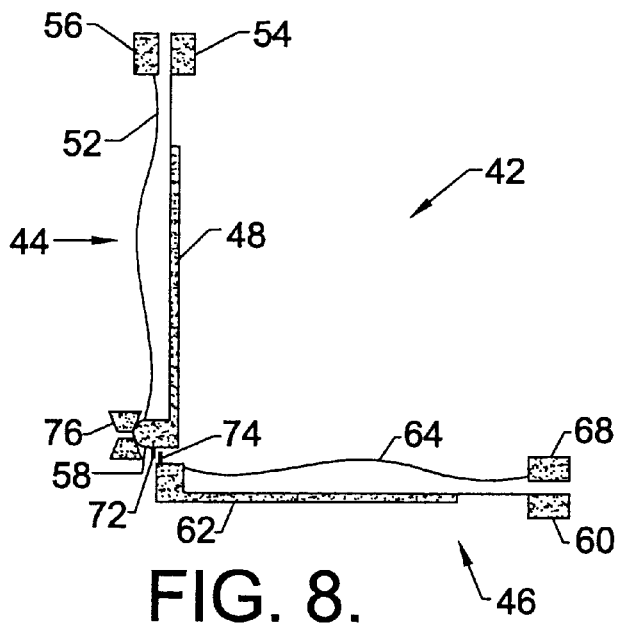

Referring now to FIG. 8, the microelectromechanical switch 42 is shown in a closed state in accordance with embodiments of the present invention. Specifically, the control voltage $V_{ctrl}$ is removed from the first actuator 44 before it is removed from the second actuator 46. As a result, the first actuator 44 deflects towards the beam member 52 in a "back-bending" configuration discussed hereinabove due to the localized annealing of the beam member 52. The contact 58 engages the pair of switch contacts 76 to electrically connect the pair of switch contacts 76. The second actuator 46 deflects towards the member 64 in a "back-bending" configuration such that the first tab 72 engages the second tab 74 between the switch contacts 76 and the second tab 74 to thereby inhibit disengagement of the contact 58 from the pair of switch contacts 76.

Figure 9:
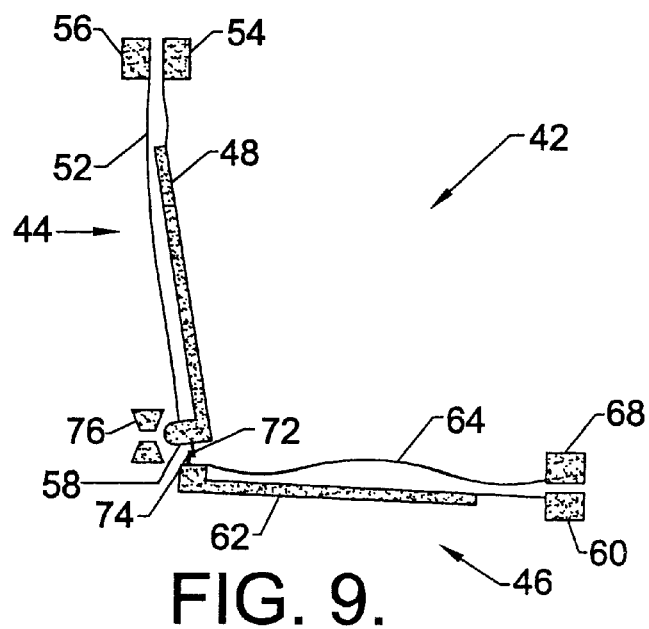

Referring now to FIG. 9, the microelectromechanical switch 42 is shown in an open state in accordance with embodiments of the present invention. Specifically, the control voltage $V_{ctrl}$ is removed from the second actuator 46 before it is removed from the first actuator 44. As a result, the second actuator 46 deflects towards the beam member 64 in a "back-bending" configuration discussed hereinabove due to the localized annealing of the beam member 64. The first actuator 44 deflects towards beam member 52 in a "back-bending" configuration such that the second tab 74 engages the first tab 72 between the pair of switch contacts 76 and the first tab 72 to thereby maintain separation between the pair of switch contacts 76 and the contact 58.

Figure 10:
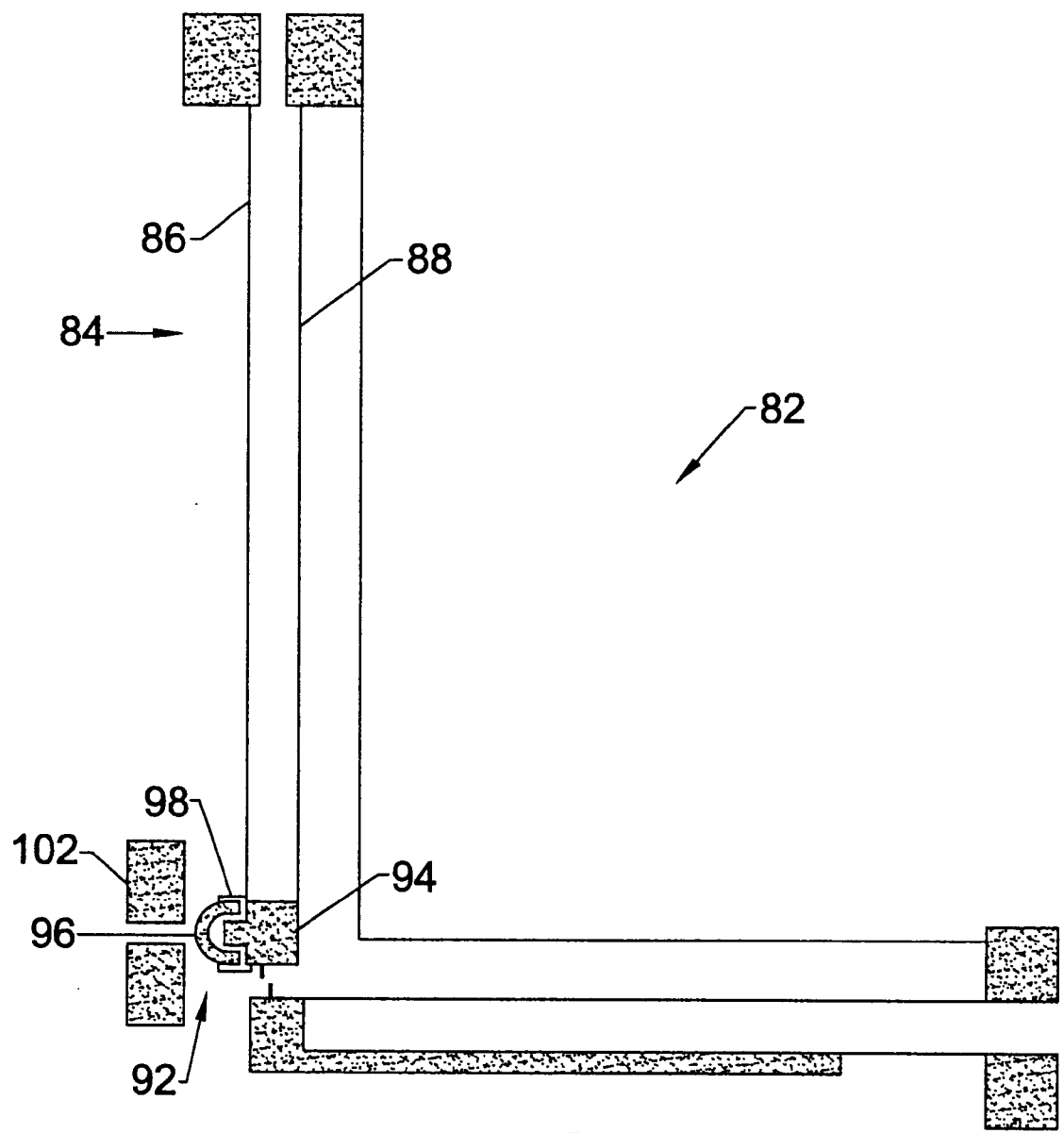
FIG. 10 illustrates a contact for use in microelectromechanical devices in accordance with embodiments of the present invention.

It may be desirable to electrically isolate the switch actuators from the switch itself so that the control signals are isolated from load signals. Referring now to FIG. 10, a microelectromechanical switch 82 is shown that includes an actuator 84 that comprises a beam member 86, a beam member 88, and a contact 92. In accordance with embodiments of the present invention, the contact 92 comprises a first conductive region 94 that connects ends of the beam member 86 and the beam member 88. The contact 92 further comprises a second conductive region 96 that is electrically isolated from the first conductive region 94 by an isolation region 98. The second conductive region 96 is configured to engage the pair of switch contacts 102. In particular embodiments of the present invention, the first and the second conductive regions 94 and 96 may comprise nickel, and the isolation region 98 may comprise silicon nitride. A contact 92 embodied as discussed in the foregoing may provide approximately 300 V dielectric isolation between the control signals carried by the beam member 86 and the beam member 88 and the load signals carried by the pair of switch contacts 102.

Figure 11:
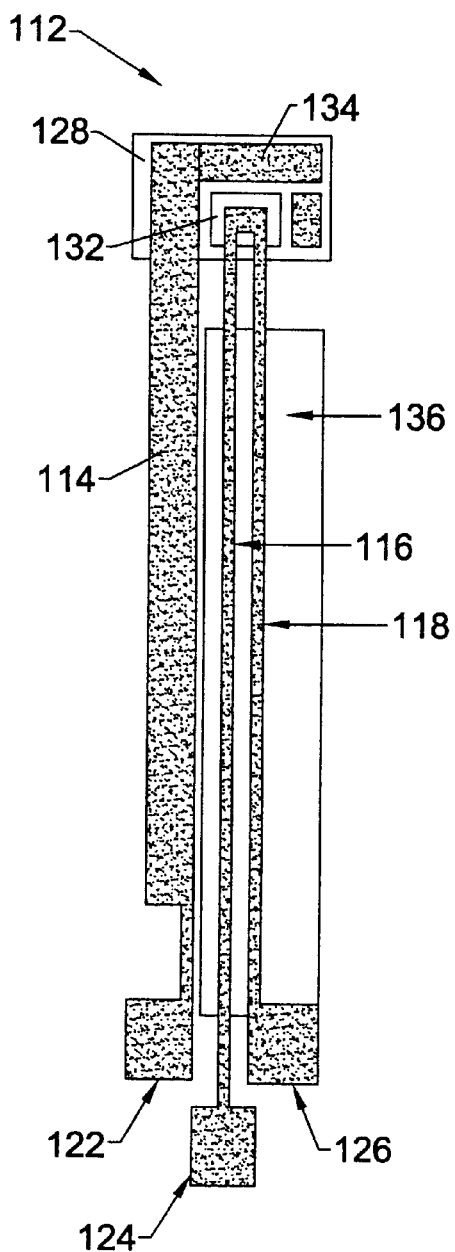
FIGS. 11 and 12 illustrate microelectromechanical devices in accordance with further embodiments of the present invention.

Referring now to FIGS. 11–16, microelectromechanical devices that are operable in response to thermal energy, in accordance with embodiments of the present invention, will be described hereafter. As shown in FIG. 11, a microelectromechanical device 112 comprises a passive beam member 114, a first active beam member 116, and a second active beam member 118. The passive beam member 114 is connected at a first end to a first anchor 122, the first active beam member 116 is connected at a first end to a second anchor 124, and the second active beam member 118 is connected at a first end to a third anchor 126. The first and the second active beam members 116 and 118 are also connected to each other. The microelectromechanical device 112 further comprises a dielectric tether 128 that has a first tether anchor 132 attached thereto that connects the second ends of the first and the second active beam members 116 and 118 to the dielectric tether. The dielectric tether 128 also has a second tether anchor 134 attached thereto that is connected to the second end of the passive beam member. In other embodiments of the present invention, the dielectric tether 128 need not be connected to the first and the second active beam members 116 and 118, and/or the passive beam member 114 at end points thereof. Operations for connecting two structures through a dielectric and structures formed thereby are described in U.S. Pat. No. 6,268,635 (application Ser. No. 09/366,933), the disclosure of which is hereby incorporated herein by reference.

Figure 12:
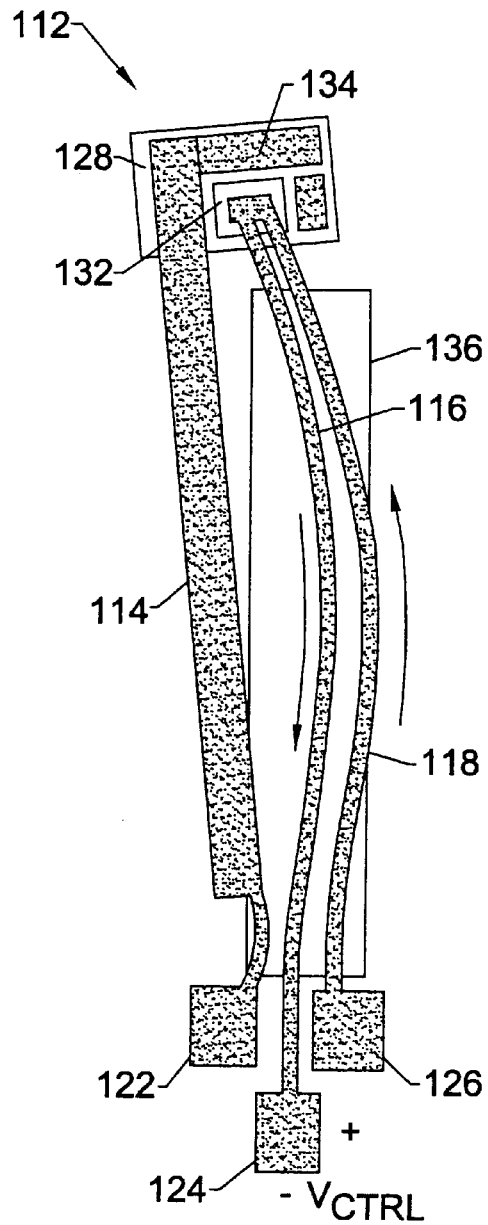

Referring now to FIG. 12, by applying a control voltage $V_{ctrl}$ to generate a current through the microelectromechanical device 112, the dielectric tether 128 (i.e., the tip of the microelectromechanical device 112) is caused to deflect towards the passive beam member 114. For example, by passing current through the active beam members 116 and 118, at least one of the active beam members 116 and 118 may be heated relative to the passive beam member 114. This causes one or both of the active beam members 116 and 118 to elongate from an initial position, which exerts force on the dielectric tether 128 thereby causing the dielectric tether 128 to deflect towards the passive beam member 24.

Because of the isolation provided by the dielectric tether 128, the control signal path through the first and the second active beam members 116 and 118 and the first tether anchor 132 is electrically isolated from the load signal path through the passive beam member 114 and the second tether anchor 134. The first, second, and third anchors 122, 124, and 126 may be attached to, for example, a substrate. Furthermore, as shown in FIGS. 11 and 12, the microelectromechanical device 112 may comprise a trench 136 etched in the substrate that extends under at least a portion of the first and the second active beam members 116 and 118 to reduce the heat loss from the active beam members 116 and 118, to thereby improve actuation distance for a given control power. The trench 136 may also increase the signal isolation between the active beam members 116 and 118 and the passive beam member 114.

Figures 13, 13A:
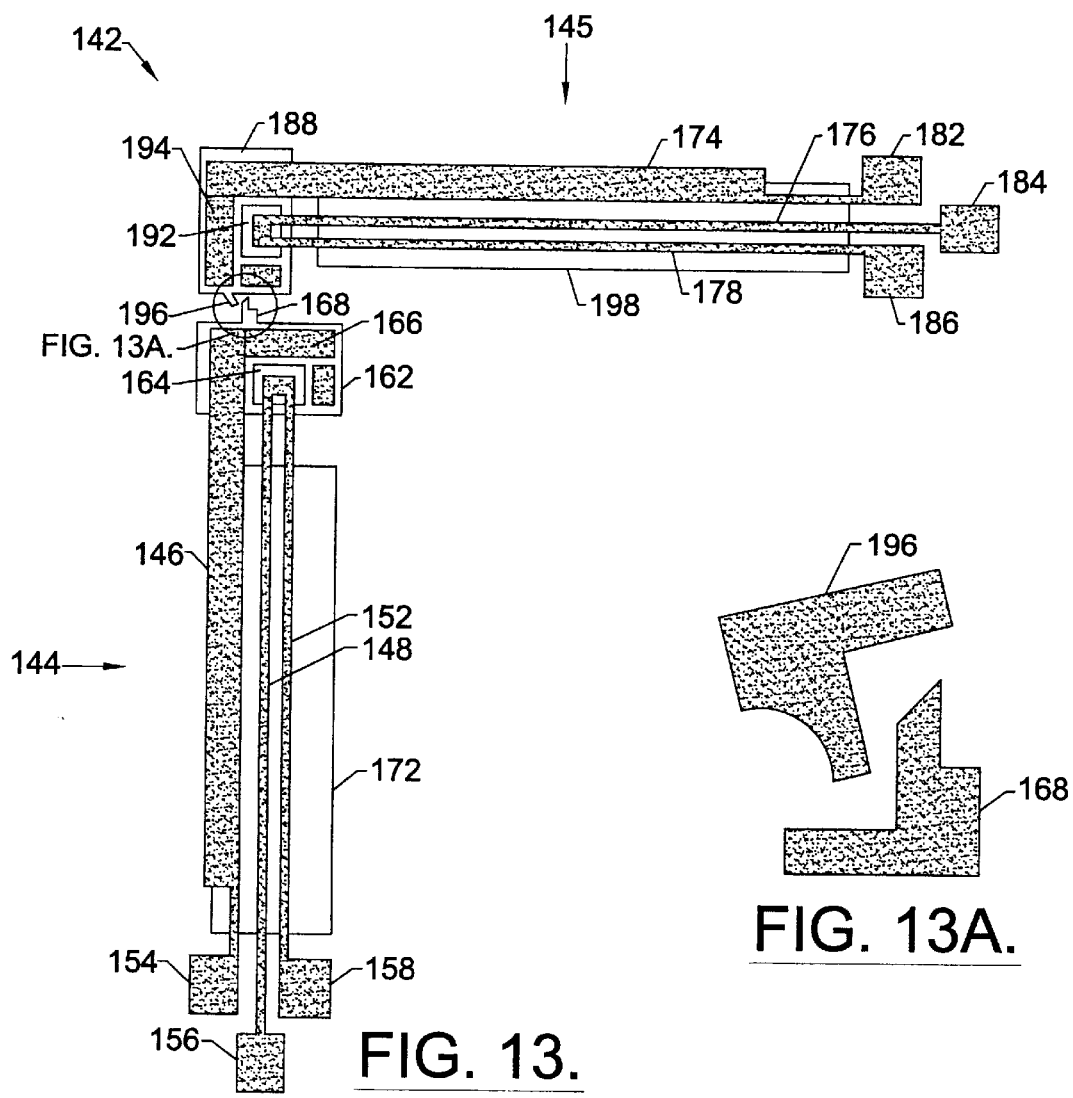
FIGS. 13–16 and 13A–16A illustrate microelectromechanical switches in accordance with further embodiments of the present invention.

Referring now to FIGS. 13–16, microelectromechanical switches, in accordance with embodiments of the present invention, will be described hereafter. As shown in FIGS. 13 and 13A, a microelectromechanical switch 142, in an "as fabricated" configuration, comprises a first actuator 144 and a second actuator 145. The first actuator 144 comprises a passive beam member 146, a first active beam member 148, and a second active beam member 152. The passive beam member 146 is connected at a first end to a first anchor 154, the first active beam member 148 is connected at a first end to a second anchor 156, and the second active beam member 152 is connected at a first end to a third anchor 158. The first actuator 144 further comprises a dielectric tether 162 that has a first tether anchor 164 attached thereto that connects the second ends of the first and the second active beam members 148 and 152. The dielectric tether 162 also has a second tether anchor 166 attached thereto that is connected to the second end of the passive beam member 146 and has a first tab 168 disposed thereon. The first, second, and third anchors 154, 156, and 158 may be attached to, for example, a substrate. A trench 172 that extends under at least a portion of the first and the second active beam members 148 and 152 may be etched in the substrate.

Similarly, the second actuator 145 comprises a passive beam member 174, a first active beam member 176, and a second active beam member 178. The passive beam member 174 is connected at a first end to a fourth anchor 182, the first active beam member 176 is connected at a first end to a fifth anchor 184, and the second active beam member 178 is connected at a first end to a sixth anchor 186. The second actuator 145 further comprises a dielectric tether 188 that has a first tether anchor 192 attached thereto that connects the second ends of the first and the second active beam members 176 and 178. The dielectric tether 188 also has a second tether anchor 194 attached thereto that is connected to the second end of the passive beam member 194 and has a second tab 196 disposed thereon. The fourth, fifth, and sixth anchors 182, 184, and 186 maybe attached to, for example, the substrate. A trench 198 that extends under at least a portion of the first and the second active beam members 176 and 178 may be etched in the substrate.

Figures 14, 14A:
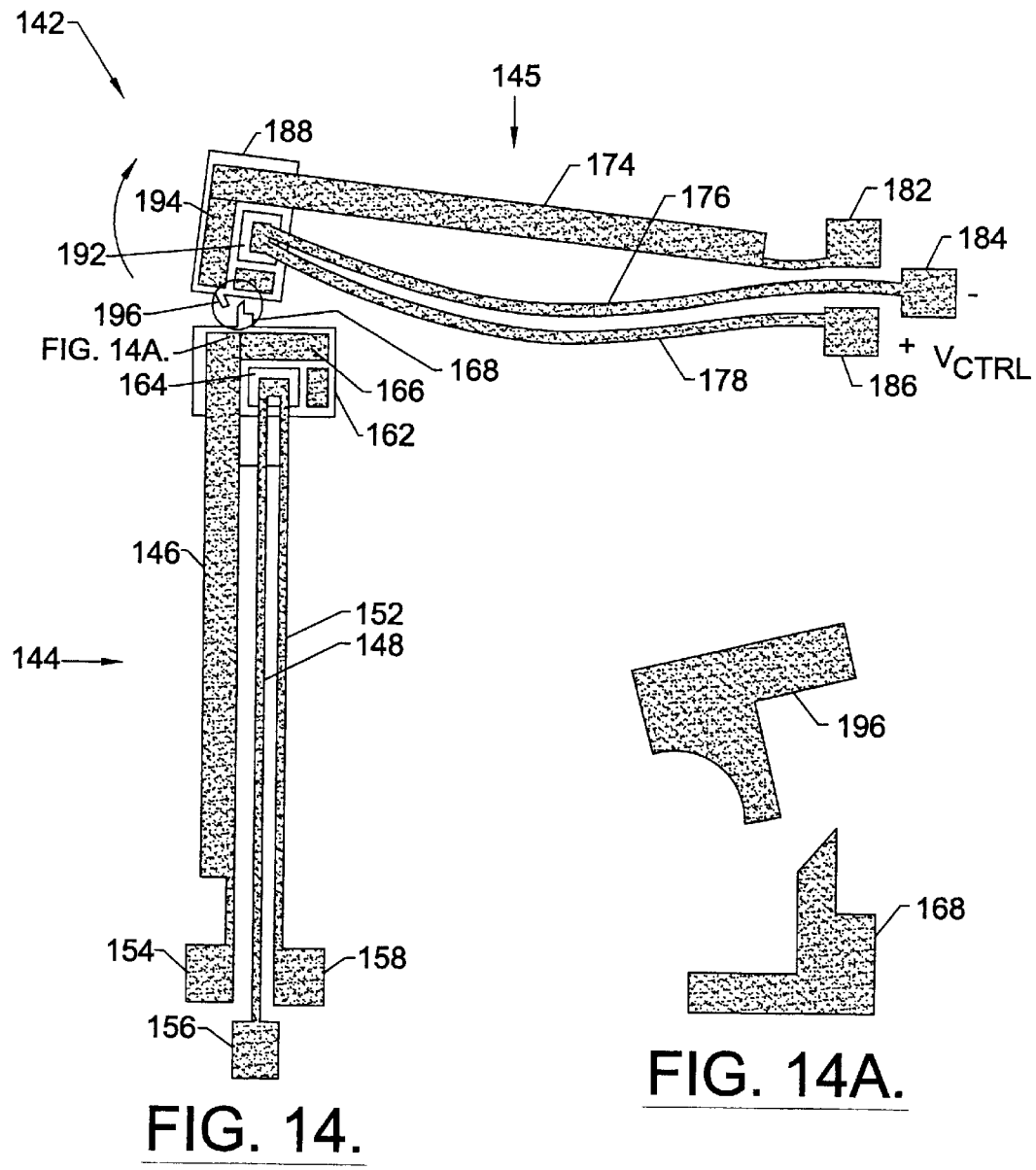
Figures 15, 15A:
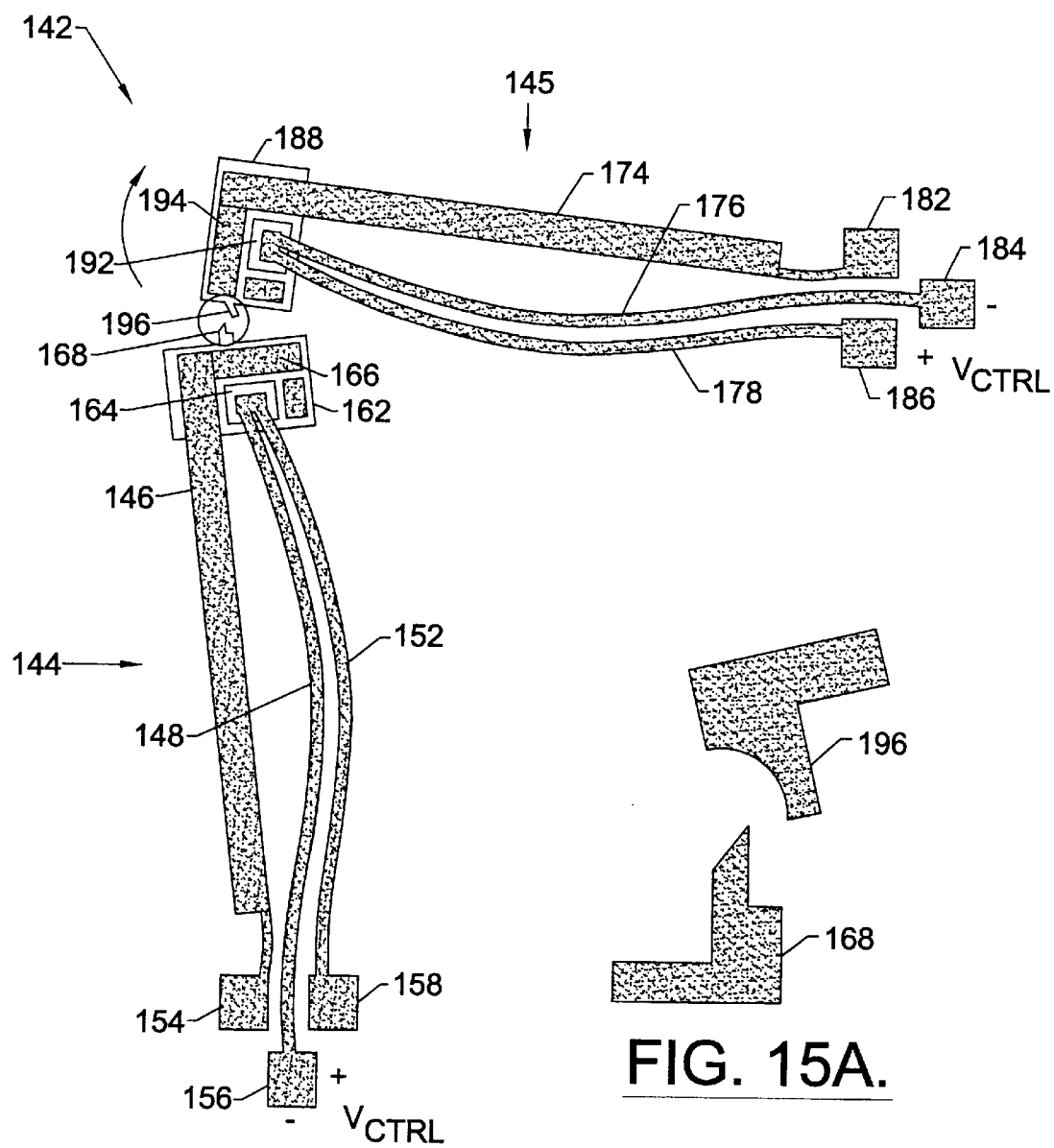

Referring now to FIGS. 14 and 14A, a control voltage $V_{ctrl}$ is applied to the fifth and the sixth anchors 184 and 186 to cause a current to flow through the first and the second active beam members 176 and 178 of the second actuator 145, which results in deflection of the second actuator 145 towards the passive beam member 174. Next, as shown in FIGS. 15 and 15A, a control voltage $V_{ctrl}$ is applied to the second and the third anchors 156 and 158 to cause a current to flow through the first and the second active beam members 148 and 152 of the first actuator 144, which results in deflection of the first actuator 144 towards the passive beam member 146.

Depending on the order in which the control voltage $V_{ctrl}$ is removed from the first and the second actuators 144 and 145 to terminate the respective control currents therein, the first and the second tabs 168 and 196 may engage one another to close the microelectromechanical switch 142 or may be disengaged from one another so that the microelectromechanical switch 142 remains open.

Figures 16, 16A:
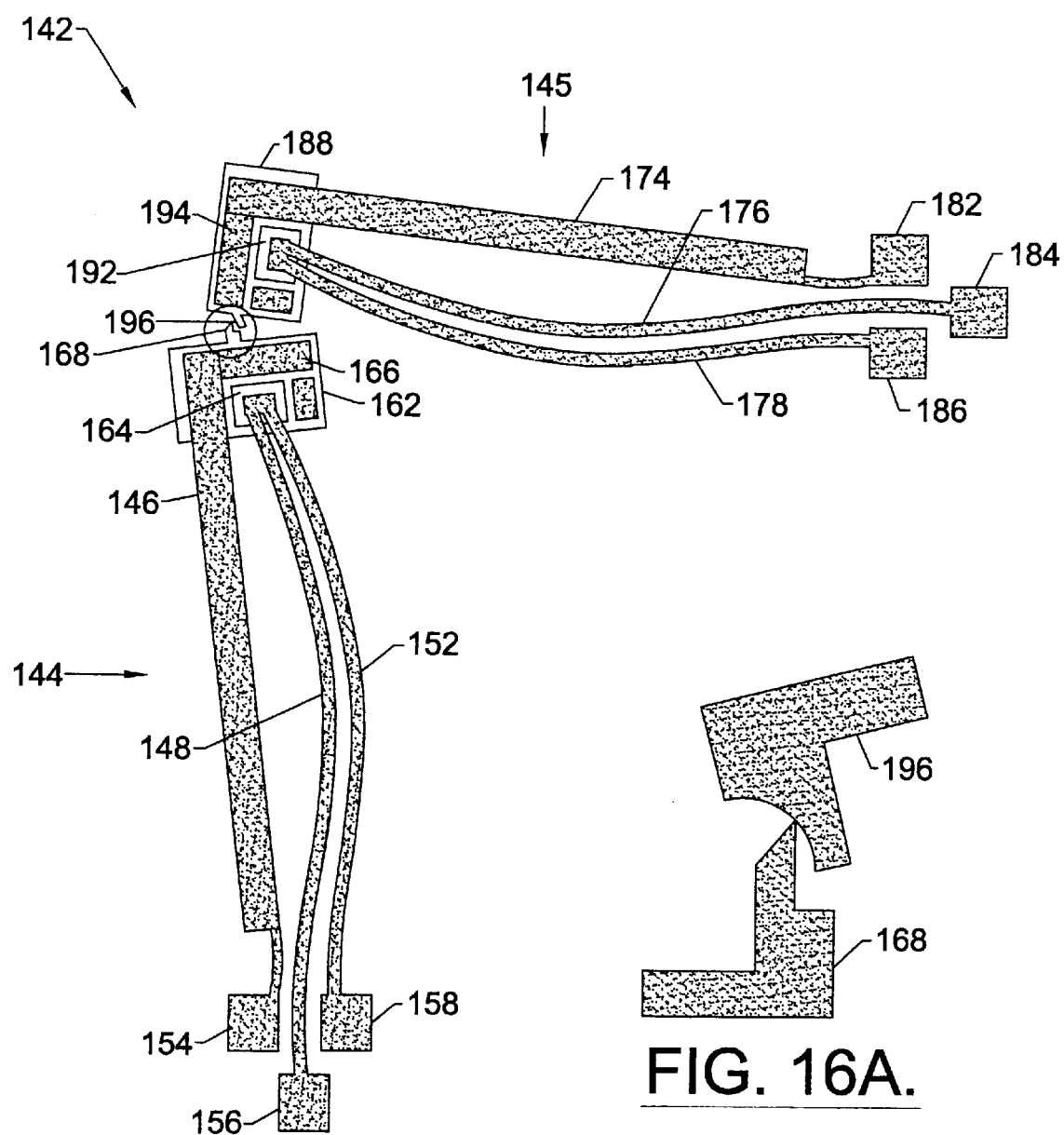

Referring now to FIGS. 16 and 16A, the microelectromechanical switch 142 is shown in a closed state in accordance with embodiments of the present invention. Specifically, the control voltage $V_{ctrl}$ is removed from the second actuator 145 before it is removed from the first actuator 144. As a result, the second actuator 145 deflects towards the first and the second active beam members 176 and 178. Next, the first actuator 144 deflects towards the first and the second active beam members 148 and 152 until the first tab 168 engages the second tab 196 to thereby close the microelectromechanical switch 142. If the control voltage $V_{ctrl}$ is removed from the first actuator 145 before it is removed from the second actuator 145, then the first tab 168 will fail to engage the second tab 196, thereby leaving the microelectromechanical switch 142 in an open state.

Thus, microelectromechanical devices 112 may be used to form microelectromechanical switches 142 that provide a single contact latching switch. Moreover, the microelectromechanical devices 112 need not be annealed (i.e., excessive current applied to the active beam members to cause localized annealing as discussed hereinabove) to facilitate switching and latching of a microelectromechanical switch 142.

Figure 17:
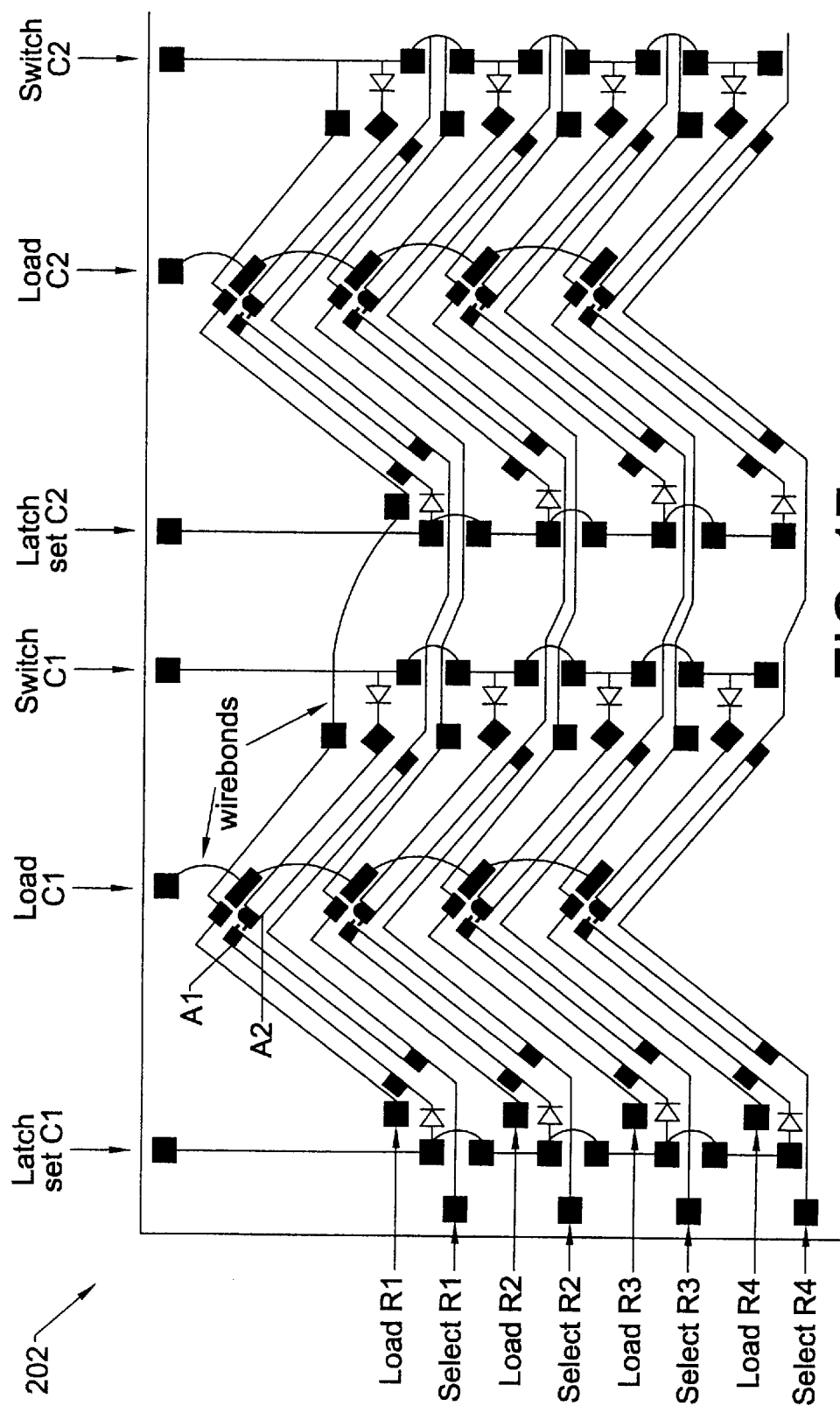
FIG. 17 illustrates a switching array in accordance with embodiments of the present invention.

Microelectromechanical switches, such as those discussed with respect to microelectromechanical switches 42 and 142 may be arrayed to form a non-blocking cross-connect switch array. Referring now to FIG. 17, an exemplary switching array, in accordance with embodiments of the present invention, will be discussed hereafter. As shown in FIG. 17, a switching array 202 comprises a substrate having a plurality of row signal paths Load R1, Load R2, Load R3, and Load R4 disposed thereon. Each row signal path comprises a plurality of first switch contacts, i.e., one switch contact at each column intersection. The switching array 202 substrate also has a plurality of column signal paths Load C1 and Load C2 disposed thereon. Each column signal path comprises a plurality of second switch contacts, i.e., one switch contact at each row intersection. The plurality of second switch contacts for each column signal path are connected by wirebonds. Moreover, wirebonds may be used to connect segments of the row signal paths between the microelectromechanical switches.

The switching array 202 is illustrated using microelectromechanical switches, such as the microelectromechanical switches 42 discussed hereinabove with respect to FIGS. 6–9. It should nevertheless be understood that microelectromechanical switches, such as the microelectromechanical switches 142 discussed hereinabove with respect to FIGS. 13–16, may be used in alternative embodiments of the switching array 202. Advantageously, in accordance with embodiments of the present invention, the microelectromechanical switches 42 and/or 142 may be fabricated at a density of approximately 150 contacts/cm².

The switching array 202 of FIG. 17 relies on one pair of actuators forming a latching switch at each row-column intersection. As shown in FIG. 17, each actuator in an actuator pair is connected to a diode, which inhibits current from the opposing actuator from flowing through the actuator. In other embodiments, the actuator pairs may be addressed individually instead of by row and column, which may obviate the need for the diodes. At the intersection of rows and columns, the state of the microelectromechanical switch determines whether row input signals on the row signal paths Load R1, Load R2, Load R3, and Load R4 are passed to the corresponding column output. A connection between a row and a column may be illustrated by way of example. In this example, $V_{high}$ is a voltage that is sufficient to cause a current in an actuator to flow, which results in a deflection in the actuator sufficient to operate the device. Note that the current will flow in an actuator only if there is a potential difference across the input terminals of the actuator. It should be further understood that $V_{isolate}$ means any connection that is isolated from a common potential (e.g., ground potential) by more than about ten times the resistance of an actuator and that is also set to approximately zero volts.

To connect the first row R1 to the first column C1 (i.e., the Load R1 signal path to the Load C1 signal path), the following operations may be performed:

First, the Latch set C1 terminal is driven to $V_{high}$ and the Select R1 terminal is driven to $V_{ground}$ (i.e., common potential, ground potential, and/or approximately zero volts). This creates a current path through actuator A1.

While the Latch set C1 terminal is driven to $V_{high}$, the Switch C1 terminal is driven to $V_{high}$. This creates a current path through actuator A2. As a result, both actuator A1 and actuator A2 are deflected away from the switch contacts at the intersection of the first row R1 and the first column C1.

While the Latch set C1 terminal is still driven to $V_{high}$, the Switch C1 terminal is driven to $V_{isolate}$. This allows the actuator A2 to return to its "back-bent" position, thereby electrically connecting the switch contacts at the intersection of the first row R1 with the first column C1.

The Latch set C1 terminal may now be driven to $V_{isolate}$, thereby causing the actuator A1 to "latch" the actuator A2 in the switch closed state. As a result, the Load R1 signal path is connected to the Load C1 signal path.

To disconnect the Load R1 signal path from the Load C1 signal path the following operations may be performed:

Drive the Latch set C1 terminal to $V_{high}$, the Switch C1 terminal to $V_{high}$, and the Select R1 terminal to $V_{ground}$. This causes both actuators A1 and A2 to deflect, thereby opening the switch contacts at the intersection of the first row R1 with the first column C1.

While the Switch C1 terminal is still driven to $V_{high}$, the Latch set C1 terminal is set to $V_{isolate}$, thereby causing the actuator A1 to engage the actuator A2.

The Switch C1 terminal may now be driven to $V_{isolate}$, which allows the actuator A2 to relax and to come into engagement with the actuator A1 to thereby maintain the switch contacts at the intersection of the first row R1 with the first column C1 in the switch open state.

As discussed hereinabove, the plurality of second switch contacts for each column signal path may be connected by wirebonds. Moreover, wirebonds may be used to connect segments of the row signal paths between the microelectromechanical switches. It may be desirable in certain applications, however, to use a second plane of wiring to implement the crossover connections provided by the wirebonds.

Figure 18:
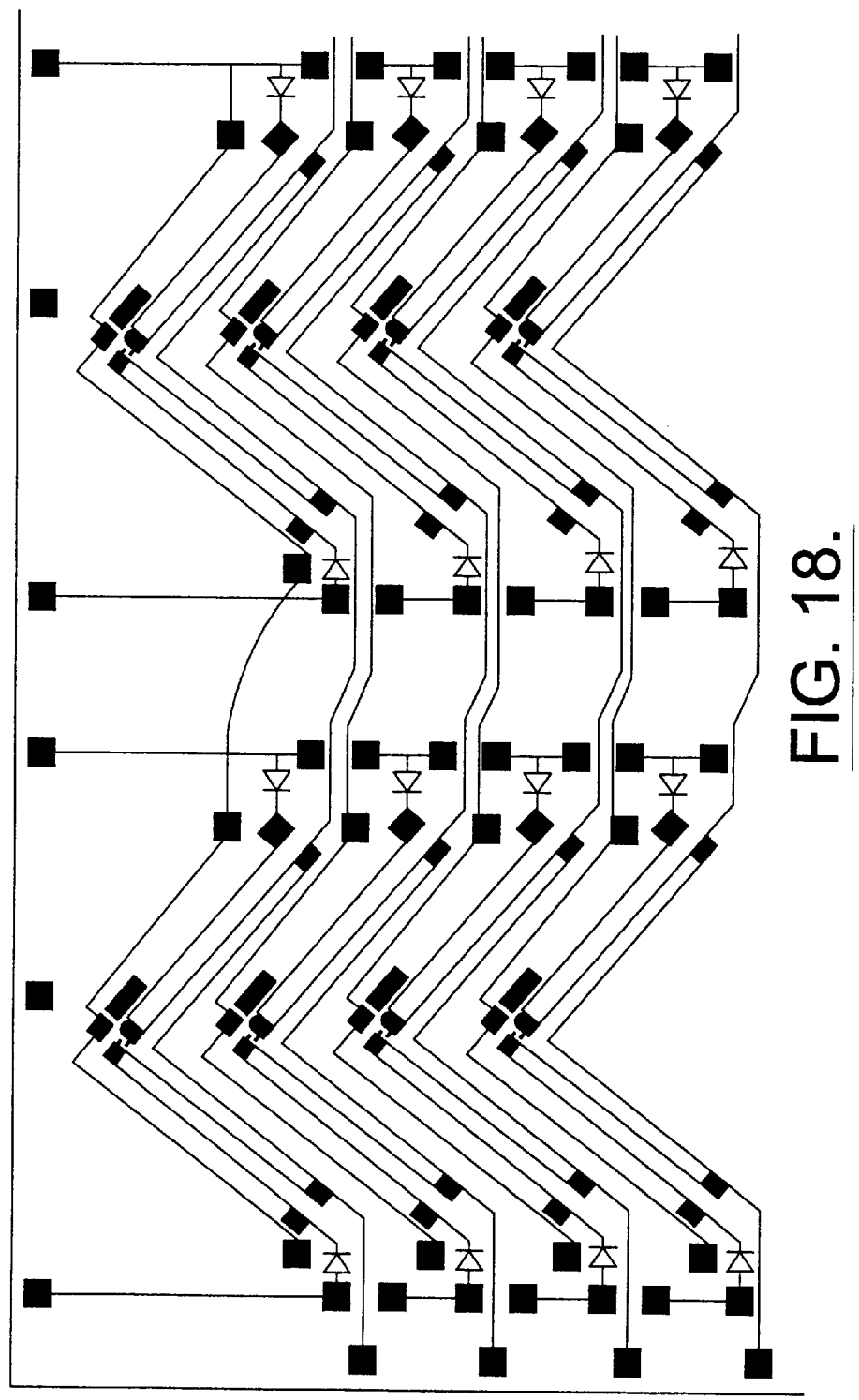
FIG. 18 illustrates a switch array die substrate in accordance with embodiments of the present invention.
Figure 19:
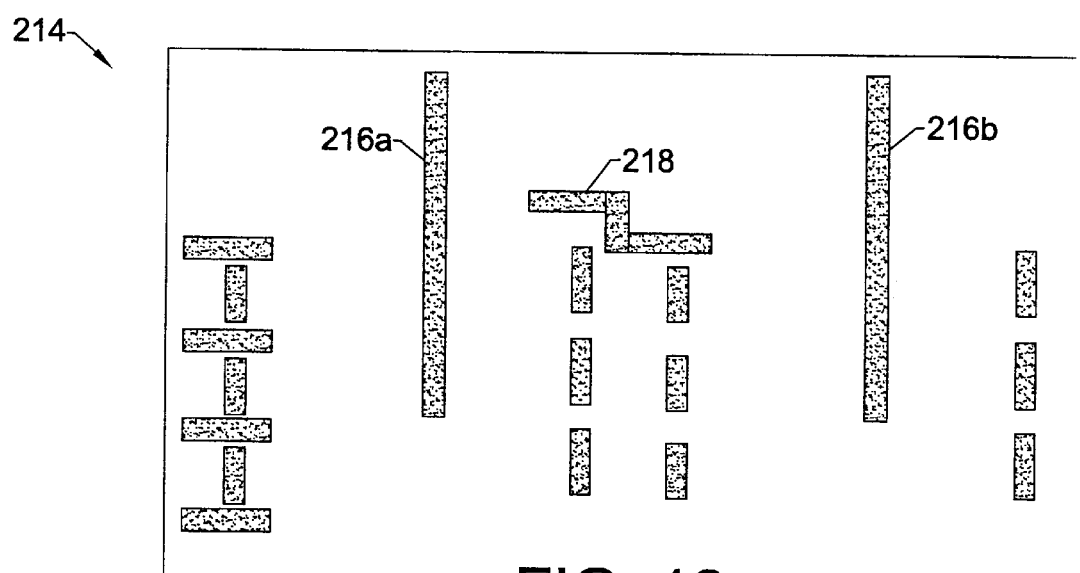
FIG. 19 illustrates a substrate or chip board that includes conductive paths that are associated with conductive paths on the switch array die substrate of FIG. 18.

Referring now to FIG. 18, a switch array die substrate 212 may be used that comprises many of the connections for implementing, for example, the switching array 202 of FIG. 17. A second substrate or chip board 214 shown in FIG. 19 may also be used, however, that includes conductive paths 216a and 216b that, when the second substrate is connected to the switch array die substrate 212, connect the switch contacts that comprise the column signal paths Load C1 and Load C2 together, respectively. The second substrate further comprises conductive path 218, which, when connected to the switch array die substrate 212, connects the segments comprising the Load R1 signal path together. In addition, the second substrate may include additional conductive paths to connect control terminals to input/output signal lines and to control signal lines on the switch array die substrate 212 together.

Figure 20:
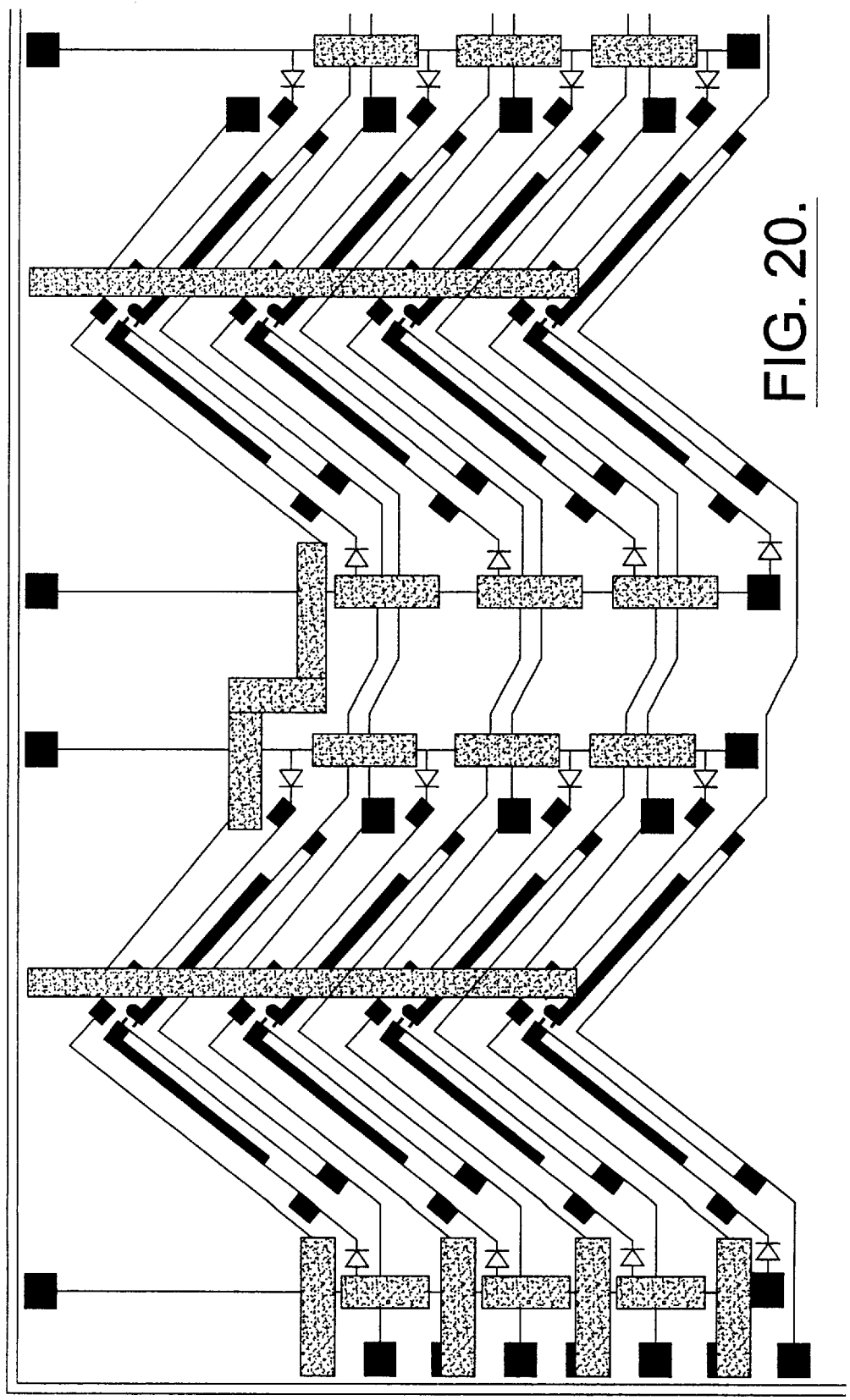
FIG. 20 illustrates the switch array die substrate of FIG. 18 joined with the substrate or chip board of FIG. 19.

Referring now to FIG. 20, the second substrate 214 is shown connected to the switch array die substrate 212, in accordance with embodiments of the present invention. The second substrate 214 may be connected to the switch array die substrate 212 via solder bumps. That is, a bump pattern may be fabricated on the second substrate 214 and then the second substrate 214 maybe joined to the switch array die substrate 212 using conventional solder joining techniques. The second substrate 214 may comprise ceramic, silicon, or FR4, which is a glass fiber epoxy laminate.

The second substrate 214 may serve as a relay housing to provide environmental protection for the switching array. Other functionality may also be provided via the second substrate 214. For example, an application specific integrated circuit (ASIC) chip, which is designed as a row-column driver device for a switching array, may be mounted directly on the second substrate 214. This may reduce the number of input/output lines from the switch array die substrate 214, and may permit driving the switching array with TTL or CMOS level signals. The second substrate may also be used to optimize the routing for input/output lines so that, for example, all input/output lines are redistributed to one side of the chip, or evenly distributed around the perimeter of the chip.

Many variations and modifications can be made to the preferred embodiments without substantially departing from the principles of the present invention. All such variations and modifications are intended to be included herein within the scope of the present invention, as set forth in the following claims.

We claim:

1. A microelectromechanical device, comprising:
    a first beam member that has an end that is connected to a first anchor;
    a second beam member that has an end that is connected to a second anchor, the second beam member being configured to elongate when the second beam member is heated to a temperature that is greater than a temperature of the first beam member; and
    a contact that comprises a first conductive region that connects the first and the second beam members, a second conductive region, and an isolation region that electrically isolates the first conductive region from the second conductive region.

2. The microelectromechanical device of claim 1, wherein the first and the second conductive regions comprise nickel, and the isolation region comprises silicon nitride.

3. The microelectromechanical device of claim 1, further comprising:
    a tab attached to the contact.

4. The microelectromechanical device of claim 1, further comprising:
    a substrate, wherein the first and the second anchors are attached to the substrate.

5. A microelectromechanical device, comprising:
    a first beam member that has an end that is connected to a first anchor;
    a second beam member that has an end that is connected to a second anchor;
    a third beam member that is connected to the second beam member and has an end that is connected to a third anchor, a respective one of the second and third beam members being configured to elongate when the respective one of the second and third beam members is heated to a temperature that is greater than a temperature of the first beam member; and
    a dielectric tether that has a first tether anchor attached thereto that connects the second and the third beam members to the dielectric tether, and a second tether anchor attached thereto that is connected to the first beam member.

6. The microelectromechanical device of claim 5, further comprising:
    a tab attached to the dielectric tether.

7. The microelectromechanical device of claim 5, further comprising:
    a substrate, wherein the first, the second, and the third anchors are attached to the substrate.

8. The microelectromechanical device of claim 7, wherein the substrate has a trench etched therein that extends under at least a portion of the second and the third beam members.

9. A method of operating a microelectromechanical device, comprising:
    providing first and second beam members that are connected to each other and have respective ends that are connected to first and second anchors;

providing a third beam member that has an end that is connected to a third anchor, the third beam member being connected to a second tether anchor;

providing a dielectric tether having a first tether anchor attached thereto that connects the first and the second beam members to the dielectric tether and a second tether anchor attached thereto that connects the third beam member to the dielectric tether; and generating a current through the first and the second beam members to deflect the dielectric tether from an initial position towards the third beam member.

10. The method of claim 9, further comprising:

terminating the current generated through the first and the second beam members to cause the dielectric tether to deflect towards the initial position.

11. The method of claim 9, wherein the first, the second, and the third anchors are connected to a substrate.

12. A microelectromechanical switch, comprising:

a substrate;

a pair of switch contacts attached to the substrate;

a first actuator that has a first end that is connected to the substrate and that has a contact connected thereto, the first actuator further comprising a first tab attached to the contact, the first actuator being operable to deflect in response to an electrical current; and a second actuator that has a first end that is connected to the substrate and that has a second tab connected thereto, the second actuator being operable to deflect in response to an electrical current;

wherein the first and the second actuators are positioned such that the contact electrically connects the pair of switch contacts when the first tab engages the second tab between the pair of switch contacts and the second tab, and the contact does not electrically connect the pair of switch contacts when the second tab engages the first tab between the pair of switch contacts and the first tab.

13. The microelectromechanical switch of claim 12, wherein the first and the second actuators each comprise:

a first beam member that has an end that is connected to a first anchor on the substrate; and a second beam member that has an end that is connected to a second anchor on the substrate, the second beam member being configured to elongate when the second beam member is heated to a temperature that is greater than a temperature of the first beam member.

14. The microelectromechanical switch of claim 13, wherein the contact comprises a first conductive region that connects the first beam member and the second beam member of the first actuator, a second conductive region, and an isolation region that electrically isolates the first conductive region from the second conductive region.

15. The microelectromechanical switch of claim 14, wherein the first and the second conductive regions comprise nickel, and the isolation region comprises silicon nitride.

16. A microelectromechanical switch, comprising:

a substrate;

a first actuator that has an end that is connected to the substrate and that has a first tab connected thereto; and a second actuator that has an end that is connected to the substrate and that has a second tab connected thereto, the first and second actuators being operable such that the first tab engages the second tab when the first and the second actuators are in a first position, and the first tab is disengaged from the second tab when the first and the second actuators are in a second position;

wherein the first and the second actuators each comprise:

a first beam member that has an end that is connected to a first anchor on the substrate;

a second beam member that has an end that is connected to a second anchor on the substrate;

a third beam member that is connected to the second beam member and that has an end that is connected to a third anchor on the substrate, a respective one of the second and the third beam members being configured to elongate when the respective one of the second and the third beam members is heated to a temperature that is greater than a temperature of the first beam member; and a dielectric tether that has a first tether anchor attached thereto that connects the second and the third beam members to the dielectric tether, and a second tether anchor attached thereto that connects the first beam member to the dielectric tether.

17. The microelectromechanical switch of claim 16, wherein the first and the second tabs are attached to the second tether anchors connected to the first beam members of the first and the second actuators, respectively.

18. The microelectromechanical switch of claim 16, wherein the substrate has a trench etched therein that extends under at least a portion of the second and the third beam members of one of the first and the second actuators.

19. A method of operating a microelectromechanical switch, comprising:

providing a substrate;

providing a pair of switch contacts that are attached to the substrate;

providing a first actuator that has an end that is connected to the substrate and that has a contact connected thereto, the first actuator further comprising a first tab attached to the contact, the first actuator being operable to deflect in response to an electrical current;

providing a second actuator that has an end that is connected to the substrate and that has a second tab connected thereto, the second actuator being operable to deflect in response to an electrical current;

generating a current through the second actuator to deflect the second actuator away from the pair of switch contacts; and generating a current through the first actuator to deflect the first actuator away from the pair of switch contacts.

20. The method of claim 19, further comprising:

terminating the current generated through the first actuator to cause the first actuator to deflect towards the pair of switch contacts such that the contact electrically connects the pair of switch contacts; then terminating the current generated through the second actuator to cause the second actuator to deflect towards the pair of switch contacts such that the first tab engages the second tab between the pair of switch contacts and the second tab.

21. The method of claim 19, further comprising:

terminating the current generated through the second actuator to cause the second actuator to deflect towards the pair of switch contacts; then terminating the current generated through the first actuator to cause the first actuator to deflect towards the pair of switch contacts such that the second tab engages the first tab between the pair of switch contacts and the first tab thereby maintaining separation between the pair of switch contacts and the contact.

22. The method of claim 19, wherein the first and the second actuators each comprise:
   a first beam member that has an end that is connected to a first anchor on the substrate; and
   a second beam member that has an end that is connected to a second anchor on the substrate, the second beam member being configured to elongate when the second beam member is heated to a temperature that is greater than a temperature of the first beam member.

23. The method of claim 22, wherein generating the current through the first actuator comprises:
   generating the current through the second beam member of the first actuator to heat the second beam member of the first actuator and to cause localized annealing in the second beam member of the first actuator; and
   wherein generating the current through the second actuator comprises:
      generating the current through the second beam member of the second actuator to heat the second beam member in the second actuator and to cause localized annealing in the second beam member of the second actuator.

24. A method of operating a microelectromechanical switch, comprising:
   providing a substrate;
   providing a first actuator that has an end that is connected to the substrate and that has a first tab connected thereto, the first actuator being operable to deflect in response to an electrical current;
   providing a second actuator that has an end that is connected to the substrate and that has a second tab connected thereto, the second actuator being operable to deflect in response to an electrical current;
   wherein the first and the second actuators each comprise:
      first and second beam members that are connected to each other and that have respective ends that are connected to first and second anchors on the substrate;
      a third beam member that has an end that is connected to a third anchor on the substrate; and
      a dielectric tether having a first tether anchor attached thereto that connects the first and the second beam members to the dielectric tether and a second tether anchor attached thereto that connects the third beam member to the dielectric tether;
   generating a current through the first and the second beam members of the first actuator to deflect the dielectric tether of the first actuator from an initial position towards the third beam member of the first actuator; and
   generating a current through the first and the second beam members of the second actuator to deflect the dielectric tether of the second actuator from an initial position towards the third beam member of the second actuator.

25. The method of claim 24, further comprising:
   terminating the current generated through the first and the second beam members of the first actuator to cause the dielectric tether of the first actuator to deflect towards the initial position; and
   terminating the current generated through the first and the second beam members of the second actuator to cause the dielectric tether of the second actuator to deflect towards the initial position such that the second tab engages the first tab.

26. The method of claim 25, wherein the first tab and the second tab are attached to the second tether anchors connected to the third beam members of the first and the second actuators, respectively.

27. The method of claim 24, wherein the substrate has a trench etched therein that extends under at least a portion of the first and the second beam members of one of the first and the second actuators.

28. A switching array, comprising:
   a substrate;
   a row signal path on the substrate that comprises a plurality of first switch contacts;
   a column signal path on the substrate that comprises a plurality of second switch contacts;
   a plurality of first actuators, a respective one of the plurality of first actuators having an end that is connected to the substrate and having a contact connected thereto, the respective one of the plurality of first actuators further comprising a first tab attached to the contact, the respective one of the plurality of first actuators being operable to deflect in response to an electrical current; and
   a plurality of second actuators, a respective one of the plurality of second actuators having an end that is connected to the substrate and having a second tab connected thereto, the respective one of the plurality of second actuators being operable to deflect in response to an electrical current;
   wherein the respective one of the plurality of first actuators and the respective one of the plurality of second actuators are positioned such that the contact electrically connects a respective one of the first plurality of switch contacts to a respective one of the second plurality of switch contacts when the first tab engages the second tab between the respective one of the first plurality of switch contacts and the respective one of the second plurality of switch contacts and the second tab, and the contact does not electrically connect the respective one of the first plurality of switch contacts to the respective one of the second plurality of switch contacts when the second tab engages the first tab between the respective one of the first plurality of switch contacts and the respective one of the second plurality of switch contacts and the first tab.

29. The switching array of claim 28, wherein the respective one of the plurality of first actuators and the respective one of the plurality of second actuators each comprise:
   a first beam member that has an end that is connected to a first anchor on the substrate; and
   a second beam member that has an end that is connected to a second anchor on the substrate, the second beam member being configured to elongate when the second beam member is heated to a temperature that is greater than a temperature of the first beam member.

30. The switching array of claim 29, wherein the contact comprises a first conductive region that connects the first beam member and the second beam member of the respective one of the plurality of first actuators, a second conductive region, and an isolation region that electrically isolates the first conductive region from the second conductive region.

31. The switching array of claim 30, wherein the first and the second conductive regions comprise nickel, and the isolation region comprises silicon nitride.

32. The switching array of claim 28, wherein the respective one of the plurality of first actuators and the respective one of the plurality of second actuators each comprise:
- a first beam member that has an end that is connected to a first anchor on the substrate;
- a second beam member that has an end that is connected to a second anchor on the substrate;
- a third beam member that is connected to the second beam member and that has an end that is connected to a third anchor on the substrate, a respective one of the second and the third beam members being configured to elongate when the respective one of the second and the third beam members is heated to a temperature that is greater than a temperature of the first beam member; and
- a dielectric tether that has a first tether anchor attached thereto that connects the second and the third beam members to the dielectric tether, and a second tether anchor attached thereto that connects the first beam member to the dielectric tether.

33. The switching array of claim 32, wherein the contact comprises the second tether anchor connected to the first beam member of the respective one of the plurality of first actuators.

34. The switching array of claim 32, wherein the substrate has a trench etched therein that extends under at least a portion of the second and the third beam members of one of the respective one of the plurality of first actuators and the respective one of the plurality of second actuators.

35. The switching array of claim 28, further comprising:
- a plurality of first diodes, a respective one of the plurality of first diodes being connected to the respective one of the plurality of first actuators; and
- a plurality of second diodes, a respective one of the plurality of second diodes being connected to the respective one of the plurality of second actuators.

36. The switching array of claim 28, wherein the substrate comprises a first substrate, the switching array further comprising:
- a second substrate connected to the first substrate, the second substrate comprising:
  - a first conductive path that is electrically connected to the row signal path; and
  - a second conductive path that is electrically connected to the column signal path.

37. The switching array of claim 36, wherein the second substrate is connected to the first substrate via solder bumps.

38. The switching array of claim 36, wherein the second substrate comprises a material selected from the group of materials comprising ceramic, silicon, and FR4.

* * * * *